United States Patent
Ting et al.

(10) Patent No.: US 11,563,446 B1
(45) Date of Patent: Jan. 24, 2023

(54) EFFICIENT GENERALIZED BOUNDARY DETECTION

(71) Applicant: National Technology & Engineering Solutions of Sandia, LLC, Albuquerque, NM (US)

(72) Inventors: Christina Ting, Cedar Crest, NM (US); Richard V. Field, Jr., Albuquerque, NM (US); Tu-Thach Quach, Albuquerque, NM (US); Travis L. Bauer, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 168 days.

(21) Appl. No.: 17/219,217

(22) Filed: Mar. 31, 2021

Related U.S. Application Data (60) Provisional application No. 63/021,286, filed on May 7, 2020.

(51) Int. Cl.
  *H03M 7/34* (2006.01)
  *H03M 7/00* (2006.01)
  *H03M 7/30* (2006.01)

(52) U.S. Cl.
  CPC ....... *H03M 7/3086* (2013.01); *H03M 7/3088* (2013.01)

(58) Field of Classification Search
  CPC .................. H03M 7/3086; H03M 7/3088
  USPC ..................................... 341/50, 51
  See application file for complete search history.

(56) References Cited

U.S. PATENT DOCUMENTS

| | | | |
|---|---|---|---|
| 7,937,351 B2 * | 5/2011 | Milenova | G06F 16/284 706/45 |
| 8,781,978 B2 * | 7/2014 | Milenova | G06F 16/284 708/200 |
| 10,193,904 B2 * | 1/2019 | Kholidy | G06F 21/00 |
| 2005/0049990 A1 * | 3/2005 | Milenova | G06F 16/284 706/45 |

(Continued)

OTHER PUBLICATIONS

Aminikhanghahi, S. et al., "A survey of methods for time series change point detection," Knowl. Inf. Syst. (2017) 51:339-367.

(Continued)

*Primary Examiner* — Jean B Jeanglaude
(74) *Attorney, Agent, or Firm* — Mark A. Dodd (57) ABSTRACT

Fast, efficient, and robust compression-based methods for detecting boundaries in arbitrary datasets, including sequences (1D datasets), are desired. The methods, each employing three simple algorithms, approximate the information distance between two adjacent sliding windows within a dataset. One of the algorithms calculates an initial ordered list of subsequences; while a second algorithm updates the ordered list of subsequences by dropping a first entry and appending a last entry rather than calculating completely new ordered lists with each iteration. Large values in the distance metric are indicative of boundary locations. A smoothed z-score or a wavelet-based algorithm may then be used to locate peaks in the distance metric, thereby identifying boundary locations. An adaptive version of the method employs a collection of window sizes and corresponding weighting functions, making it more amenable to real datasets with unknown, complex, and changing structures.

17 Claims, 5 Drawing Sheets

(56) References Cited

U.S. PATENT DOCUMENTS

2009/0132447 A1* 5/2009 Milenova .............. G06F 16/284 706/12
2017/0019419 A1* 1/2017 Kholidy .............. H04L 63/1416

OTHER PUBLICATIONS

Bogomolov, A. et al., "Generalized Compression Dictionary Distance as Universal Similarity Measure," eprint arXiv: 1410.5792, Oct. 2014, 4 pages.

Brown, P. F. et al., "Class-Based n-gram Models of Natural Language," Computational Linguistics (1992) 18 (4):467-479.

Cerra, D. et al., "A fast compress-based similarity measure with applications to content-based image retrieval," J. Vis Commun. Image R. (2012) 23:293-302.

Field, Jr. R. et al., "Efficient Generalized Boundary Detection Using a Sliding Information Distance," IEEE Transactions on Signal Processing (2020) 68:6394-6401.

Foote, J., "Automatic Audio Segmentation Using a Measure of Audio Novelty," 2000 IEEE International Conference on Multimedia and Expo, ICME2000, Proceedings. Latest Advances in the Fast Changing World of Multimedia, Jul. 30-Aug. 2, New York, NY, pp. 452-455.

Koga, H. et al., "Effective Construction of Compression-based Feature Space," 2016 International Symposium on Information Theory and Its Applications (ISITA) Oct. 30-Nov. 2, Monterey, CA, pp. 116-120.

Li, M. et al., "The Similarity Metric," IEEE Transactions on Information Theory (2004) 50(12):3250-3264.

Macedonas, A. et al., "Dictionary based color image retrieval," J. Vis. Commun. Image R. (2008) 19:464-470.

Raff, E. et al., "An Alternative to NCD for Large Sequences, Lempel-Ziv Jaccard Distance," Proceedings of the 23rd ACM SIGKDD international Conference on Knowledge Discovery and Data Mining (2017) pp. 107-105.

Ziv, J. et al., "A Universal Algorithm for Sequential Data Compression," IEEE Transactions on Information Theory (1977) IT-23(3):337-343.

* cited by examiner

EFFICIENT GENERALIZED BOUNDARY DETECTION

RELATED APPLICATIONS

This application claims priority to United States Provisional Application No. 63/021,286, filed on May 7, 2020, and entitled EFFICIENT GENERALIZED BOUNDARY DETECTION, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a method for boundary detection within a dataset using compression-based analytics by approximating the information distance between two adjacent sliding windows within the dataset, wherein large values in the distance metric are indicative of boundary locations. Both fixed and adaptive methods are included.

BACKGROUND

Let z be a sequence of tokens made available over time, with a sequence being a one-dimensional (1D) dataset. This subclass of datasets is prevalent in, for example, computer network traffic, text, and audio signals. Identifying changes in z requires significant latency and domain knowledge of the underlying dataset. The goal is to determine locations within z where the information content suddenly and substantially changes, these locations are referred to as boundaries.

In other prior art techniques, general boundary or change-point detection often involves sliding adjacent windows over sequences, collecting statistics regarding the underlying data within each window, and computing a distance function that operates on these statistics to determine large distances between adjacent windows. See S. Aminikhanghahi and D.J. Cook, "A survey of methods for time series change point detection," Knowledge and Information Systems, vol. 51, pp. 339-367 (2017), the contents of which are incorporated herein by reference. For domain-specific datasets, such as audio, more specialized methods have been developed.

The normalized information distance (NID) is the optimal universal distance metric to capture the differences between two sequences. See P.M.B. Vit'anyi et al., "Normalized information distance," in Information Theory and Statistical Learning, pp. 45-82 (Springer, 2009), the contents of which are incorporated herein by reference. NID is, however, non-computable. For this reason, there has been extensive work on approximating the NID, most of which are based on the normalized compression distance (NCD). See M. Li et al., "The similarity metric," IEEE Transactions on Information Theory, vol. 50, no. 12, pp. 3250-3264 (2004), the contents of which are incorporated herein by reference.

NCD uses standard compression algorithms and is therefore easy to implement in practice, but is too costly for a sliding boundary detection application. It has been shown that NCD can be approximated by operations on the underlying dictionaries, thereby bypassing the compression step and improving the computation speed. See A. Macedonas et al., "Dictionary based color image retrieval," Journal of Visual Communication and Image Representation, vol. 19, no. 7, pp. 464-470 (2008); H. Koga et al., "Effective construction of compression-based feature space," in 2016 International Symposium on Information Theory and Its Applications (ISITA), pp. 116-120 (2016); and E. Raff and C. Nicholas, "An alternative to NCD for large sequences, Lempel-Ziv Jaccard distance," in ACM SIGKDD International Conference on Knowledge Discovery and Data Mining (2017), the contents of each of which are incorporated herein by reference.

In spite of these previous efforts, the need still exists for a method that provides an accurate approximation to the NID but is also computationally efficient. The need for computational efficiency is driven by the nature of the sliding boundary detection application, where changes in information content need to be approximated repeatedly as one progresses through z. Further, the method should be robust to small changes in information content; an algorithm that violates this requirement will produce a noisy signal that renders boundary detection difficult.

SUMMARY

One aspect of the present invention relates to a method for boundary detection within datasets using compression-based analytics. The method approximates the information distance between two adjacent sliding windows within a dataset, for example, a sequence (1D dataset). Large values in the distance metric are indicative of boundary locations. The algorithm, referred to as sliding information distance (SLID), provides a fast, accurate, and robust approximation to the NID. A modified smoothed z-score algorithm is used to locate peaks in the distance metric, indicating boundary locations.

Although other approaches may perform better for specialized applications where knowledge of the dataset is available a priori, SLID is general and applicable to a wide variety of datasets from various sources. Further, it is possible to extend SLID to streaming applications or to datasets in higher dimensions, for example, edge detection in images and flaw detection in engineering materials. SLID also offers the benefit that it is unsupervised and does not require significant training data. SLID is a variant of the dictionary-based approaches, but the dictionary construction has been further optimized for a sliding boundary detection application. Although SLID could be a variant of any of the dictionary-based approaches, in at least one embodiment of the present invention SLID builds off the Lempel Ziv Jaccard Distance (LZJD) algorithm due to its simplicity.

In at least one embodiment of the present invention, a method for detecting a boundary within a dataset (the dataset including one or more tokens) comprises the steps of initializing a set of fixed sliding information distance (SLID) scores to zero; for each potential border within the dataset generating first and second sub-dataset windows (the second sub-dataset window adjacent the first sub-dataset window at the potential border, each of the first and second sub-dataset windows being a respective sub-dataset of the dataset, each of the first and second sub-dataset windows having a single fixed window size); if the potential border is an initial potential border, computing an initial ordered list of subsequences for each token in the first and second sub-dataset windows, and if the potential border is not the initial potential border, computing a subsequent ordered list of subsequences for each token in the first and sub-dataset windows by dropping a first entry of a previous ordered list of subsequences for each token in the first sub-dataset window and the second sub-dataset window and appending an entry for a last token in the first sub-dataset window and the second sub-dataset window; computing a corresponding fixed SLID score at the potential border based on the computed initial or subsequent ordered list of subsequences; incrementing the potential border; repeating the steps of generating the first and second sub-dataset window, computing a subsequent ordered list of subsequences, computing a corresponding fixed SLID score, and incrementing the potential border for all potential borders; and identifying the boundary within the dataset at the potential border corresponding to an anomalous fixed SLID score.

In other embodiments of the present invention, the step of computing the ordered list of subsequences employs a dictionary approach; the dictionary approach includes a Lempel-Ziv, a Macedonas, a Koga, or a Cerra-Datcu dictionary approach; the step of identifying the boundary within the dataset employs a smoothed z-score algorithm with incremented potential border values and a smoothed z-score algorithm with decremented potential border values; and the step of identifying the boundary within the dataset employs a wavelet-based algorithm in which the fixed SLID score is convolved with a smoothing kernel.

In at least one additional embodiment of the present invention, a method for detecting a boundary within a dataset (the dataset including one or more tokens) comprises the steps of initializing a set of adaptive sliding information distance (SLID) scores to zero; for each potential border within the dataset initializing a set of fixed SLID scores to zero; for each of m fixed window sizes generating first and second sub-dataset windows (the second sub-dataset window adjacent the first sub-dataset window at the potential border, each of the first and second sub-dataset windows being a respective sub-dataset of the dataset, each of the first and second sub-dataset windows having an initial fixed window size); if the potential border is an initial potential border, computing an initial ordered list of subsequences for each token in the first and second sub-dataset windows; if the potential border is not the initial potential border, computing a subsequent ordered list of subsequences for each token in the first and second sub-dataset windows by dropping a first entry of a previous ordered list of subsequences for each token in the first and second sub-dataset windows and appending an entry for a last token in the first and second sub-dataset windows; computing a corresponding fixed SLID score at the potential border based on the initial or subsequent ordered list of subsequences; incrementing the fixed window size; repeating the steps of generating first and second sub-dataset windows, computing a subsequent ordered list of subsequences, computing a corresponding fixed SLID score, and incrementing the potential border for all fixed window sizes; computing a corresponding adaptive SLID score by summing the product of a respective SLID score and a respective weighting function value over all fixed window sizes; incrementing the potential border; repeating the steps of initializing a set of fixed SLID scores to zero, generating first and second sub-dataset windows, computing a subsequent ordered list of subsequences, computing a corresponding fixed SLID score, incrementing the fixed window size, computing a corresponding adaptive SLID score, and incrementing the potential border for all potential borders; and identifying the boundary within the dataset at the potential border corresponding to an anomalous adaptive SLID score.

In still other embodiments of the present invention, the step of computing the ordered list of subsequences employs a dictionary approach; the dictionary approach includes a Lempel-Ziv, a Macedonas, a Koga, or a Cerra-Datcu dictionary approach; the step of identifying the boundary within the dataset employs a smoothed z-score algorithm with incremented potential border values and a smoothed z-score algorithm with decremented potential border values; the step of identifying the boundary within the dataset employs a wavelet-based algorithm in which the fixed SLID score is convolved with a smoothing kernel; and the step of computing a corresponding adaptive SLID score employs a local range based weighting function or a global range based weighting function.

In yet another embodiment of the present invention, a computer-readable storage device comprises instructions to implement the steps of initializing a set of adaptive sliding information distance (SLID) scores to zero; for each potential border within the dataset initializing a set of fixed SLID scores to zero; for each of m fixed window sizes generating first and second sub-dataset windows (the second sub-dataset window adjacent the first sub-dataset window at the potential border, each of the first and second sub-dataset windows being a respective sub-dataset of the dataset, each of the first and second sub-dataset windows having an initial fixed window size); if the potential border is an initial potential border, computing an initial ordered list of subsequences for each token in the first and second sub-dataset windows; if the potential border is not the initial potential border, computing a subsequent ordered list of subsequences for each token in the first and second sub-dataset windows by dropping a first entry of a previous ordered list of subsequences for each token in the first and second sub-dataset windows and appending an entry for a last token in the first and second sub-dataset windows; computing a corresponding fixed SLID score at the potential border based on the initial or subsequent ordered list of subsequences; incrementing the fixed window size; repeating the steps of generating first and second sub-dataset windows, computing a subsequent ordered list of subsequences, computing a corresponding fixed SLID score, and incrementing the potential border for all fixed window sizes; computing a corresponding adaptive SLID score by summing the product of a respective SLID score and a respective weighting function value over all fixed window sizes; incrementing the potential border; repeating the steps of initializing a set of fixed SLID scores to zero, generating first and second sub-dataset windows, computing a subsequent ordered list of subsequences, computing a corresponding fixed SLID score, incrementing the fixed window size, computing a corresponding adaptive SLID score, and incrementing the potential border for all potential borders; and identifying the boundary within the dataset at the potential border corresponding to an anomalous adaptive SLID score.

In further embodiments of the present invention, the step of computing the ordered list of subsequences employs a dictionary approach; the dictionary approach includes a Lempel-Ziv, a Macedonas, a Koga, or a Cerra-Datcu dictionary approach; the step of identifying the boundary within the dataset employs a smoothed z-score algorithm with incremented potential border values and a smoothed z-score algorithm with decremented potential border values; the step of identifying the boundary within the dataset employs a wavelet-based algorithm in which the fixed SLID score is convolved with a smoothing kernel; and the step of computing a corresponding adaptive SLID score employs a local range based weighting function or a global range based weighting function.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

The Fixed SLID Algorithm

Let k denote a position within the sequence (1D dataset) z. The boundary detection problem may be formulated by considering two adjacent subsequences of z, denoted by $x_k$ and $y_k$, each of length w≥1:

$$z_0 \ldots z_{k-\omega-1} \underbrace{z_{k-\omega} \ldots z_{k-1}}_{x_k} \underbrace{z_k \ldots z_{k+\omega-1}}_{y_k} z_{k+\omega} \ldots \quad \text{(Eq. 1)}$$

The SLID score of z at position k=w, . . . , i.e., the border between the two adjacent subsequences, corresponds to:

$$S_k(z; \omega) = 1 - \frac{|D(x_k) \cap D(y_k)|}{|D(x_k) \cup D(y_k)|}, \quad \text{(Eq. 2)}$$

where D(x) denotes a set representation of the Lempel-Ziv (LZ) dictionary encoding of sequence x. See J. Ziv and A. Lempel, "A universal algorithm for sequential data compression," IEEE Transactions on Information Theory, vol. 23, no. 3, pp. 337-343 (1977), the contents of which are incorporated herein by reference. The right-hand side of Equation (2) is the Jaccard distance between two LZ sets, and $S_k$ takes values in [0, 1]. While this embodiment of the present invention employs the Lempel-Ziv dictionary approach, other embodiments of the present invention may use other dictionary approaches. See A. Macedonas et al.; H. Koga et al.; D. Cerra and M. Datcu, "A fast compression-based similarity measure with applications to content-based image retrieval," Journal of Visual Communication and Image Representation, vol. 23, no. 2, pp. 293-302 (2012); and A. Bogomolov et al., "Generalized Compression Dictionary Distance as Universal Similarity Measure," ArXiv e-prints (2014), the contents of each of which are incorporated herein by reference, for descriptions of various dictionary approaches for data compression.

The following provides three simple examples of determining a SLID score based upon a sequence of letters. In the first example, consider the case where $x_k$=ABAA and $y_k$=ABAA. Because $x_k$=$y_k$=ABAA, $D(x_k)$=$D(y_k)$={A, B, AA}. $D_x \cap D_y$={A, B, AA} and $D_x \cup D_y$={A, B, AA}. This leads to a SLID score $S_k$=0. That the SLID score corresponding to the distance between $x_k$ and $y_k$ is 0 makes intuitive sense as the two subsequences are identical.

At the opposite end of the SLID score, consider the case where $x_k$=ABAA and $y_k$=CDCC. In this case, $D(x_k)$={A, B, AA}, while $D(y_k)$={C, D, CC}. $D_x \cap D_y$={ø}, i.e., the null set as there are no values in common, and $D_x \cup D_y$={A, B, C, D, AA, CC}. This leads to a SLID score $S_k$=1. That the SLID score corresponding to the distance between $x_k$ and $y_k$ is 1 again makes intuitive sense as the two subsequences are completely different. As the SLID score is 1, this would indicate the presence of a boundary due to the large distance between the $x_k$ and $y_k$ subsequences.

As an intervening example, consider the case where $x_k$=ABC and $y_k$=BCD. In this case, $D(x_k)$={A, B, C}, while $D(y_k)$={B, C, D}. In this case, $D_x \cap D_y$={B, C}, and $D_x \cup D_y$={A, B, C, D}. This leads to a SLID score $S_k$=1−(2/4) or 0.5. Whether a SLID score of 0.5 corresponds to a boundary will depend on the application and the user-selected threshold.

At the core of SLID lies the following three algorithms:

Algorithm 1—Sliding Information Distance

1: function SLID(sequence z, window size w)
2: S←[0] list initialized with w−1 zeros.
3: for k←w, . . . do
4: $x_k$←$z_{k-w}$, . . . , $z_{k-1}$
5: $y_k$←$z_k$, . . . , $z_{k+w-1}$
6: if k==w then
7: $L_x$, $D_x$←makeLZdict($x_k$)
8: $L_y$, $D_y$←makeLZdict($y_k$)
9: else
10: $L_x$, $D_x$←updateLZdict($x_k$[−1], $L_x$)
11: $L_y$, $D_y$←updateLZdict($y_k$[−1], $L_y$)
12: end if
13: S.append(1−|$D_x \cap D_y$|/|$D_x \cup D_y$|)
14: end for
15: return S
16: end function Algorithm 2—Initialize the LZ Dictionary 1: function makeLZdict(sequence b)
2: ℓ ←[ ], start←0, end←0
3: while end<|b|do
4: item←b[start:end]
5: if item ∉ ℓ then
6: start←end
7: end if
8: ℓ .append(item)
9: end←end+1
10: end while
11: return ℓ , set(ℓ )
12: end function Algorithm 3—Update the LZ Dictionary 1: function updateLZdict(token t, list ℓ )
2: if ℓ [−1]∉ ℓ [0:−2] then
3: item←t
4: else
5: item←ℓ [−1]+t
6: end if
7: z,25 ←ℓ [1:]
8: ℓ .append(item)
9: return ℓ , set(ℓ )
10: end function Algorithm 1 represents the main computation of SLID. At an initial position k=w, the SLID values are all initialized to 0 in line 2, followed by generating the two subsequence windows $x_k$ and $y_k$ in lines 4 and 5. In lines 7 and 8, Algorithm 2 (makeLZdict) is used to compute an initial ordered LZ list of subsequences for each token in $x_w$ and $y_w$, followed by computing the Jaccard distance $S_w$ of the set representation of the LZ list in line 13. The state of the ordered LZ list is maintained, and not simply the set, so that when the position, i.e., border, is incremented to k=w+1, the LZ list need only be updated in lines 10 and 11 using Algorithm 3 (updateLZdict). Instead of recomputing the entire LZ sets of $x_{w+1}$ and $y_{w+1}$, in Algorithm 3 the first entry in the LZ list is dropped and a new entry for the last token in the new subsequence is appended. Once again, $S_{w+1}$ operates on the set representation of the updated LZ lists.

Applying Algorithm 3 to update the LZ list has two benefits. First, the computational cost of Algorithm 2 is at least O(w) as each token in the subsequence of length w has to be parsed. This cost is O(1) for Algorithm 3. Second, the updating step ensures smaller changes in the LZ set over recomputing them, resulting in a smoother SLID score for boundary detection. Algorithm 3 thus provides two significant benefits not found in the prior art, which would repeatedly employ only computationally costly Algorithm 2.

As SLID is being computed for a given sequence, the boundary locations can be estimated by identifying anomalous peak regions in the SLID scores. One then applies a smoothed z-score algorithm, i.e., a type of unsupervised change detection algorithm, to locate the peak regions. See J.-P. van Brakel, "Smoothed z-score algorithm," http://stackoverflow.com/ questions/22583391/peak-signal-detection-in-realtime-timeseries-data (accessed Mar. 10, 2020), the contents of which are incorporated herein by reference. Briefly, the algorithm identifies a point as anomalous if it exceeds a threshold of n standard deviations over a running mean of the previous m data points, where the contribution of anomalous points to the running mean is controlled through an influence parameter (see J.-P. van Brakel for details on the influence).

The smoothed z-score algorithm is executed on the sequence in the directions of increasing (forward) and decreasing (reverse) k to produce a collection of contiguous anomalous positions, denoted by sets $K_f$ and $K_r$, respectively. The peak region is defined by $K=K_f \cap K_r$. Assuming K is a nonempty set of contiguous positions, $$k^* = \underset{k \in K}{\mathrm{argmax}}\, S_k(z; \omega) \quad (\text{Eq. 3})$$

is the estimate for the boundary location k* in K. For performance assessment, the inventors assumed that boundary estimates within 16 tokens of the true boundary are true positives. Further, the algorithm requires that |K|>16 to reduce false positives. In practice, this algorithm will produce a collection of K, each containing a boundary.

The Adaptive SLID Algorithm

One drawback of the just described fixed SLID algorithm embodiment of the present invention, is that it assumes a single, fixed, and a priori known value for the window size w to be used on a given sequence z. This is a serious limitation for the practical use of SLID on real datasets with unknown, complex, and changing structures. These limitations are addressed with an adaptive version of SLID, which uses a collection of window sizes that only needs to span the structural length scales of interest in the dataset.

Let $S(k; w_i)$, i=1, . . . , m, denote a collection of SLID scores defined by Equation (2) for m distinct fixed window sizes. Adaptive SLID is defined by:

$$\overline{S}(k) = \sum_{i=1}^{m} \alpha_i(k) S(k; w_i), \, k = \overline{w}, \overline{w} + 1, \ldots, \quad (\text{Eq. 4})$$

where $\overline{S}(k)=0$ for $k<\overline{w}$, $\alpha_i(k)$ denote weights normalized such that $$\sum_{i=1}^{m} \alpha_i(k) = 1$$

for each k, and $\overline{w}=\max_{i=1,\ldots,m} w_i$. This approach yields a weighting function that emphasizes SLID scores with distinct peaks, indicating potential boundaries in the dataset. One option is to use a local range, defined as:

$$r_i(k) = {}^{max}_j S(j; w_i) - {}^{min}_j S(j; w_i) \quad (\text{Eq. 5})$$

for the ith SLID score at position k. For simplicity, this embodiment of the present invention uses the positions j over which the SLID algorithm computes the range to correspond to the two adjacent subsequences $x_k$ and $y_k$ used to compute the SLID score, i.e., $j=k-w_i, \ldots, k+w_i-1$; see Equation (1).

Because the local range depends on the position k, the weighting function is adaptive to changing sequences. Alternatively, for sequences whose properties are not expected to change, one can apply a weighting function that is independent of k. One option is to use a global range, defined by:

$$r_i = \frac{1}{|z|-2w_i} \sum_{k=w_i}^{|z|-w_i} r_i(k) \qquad (Eq. 6)$$

for the ith SLID score.

Choosing $\alpha_i(k) \propto r_i(k)$ for the local range or $\alpha_i \propto r_i$ for the global range is meant to weight SLID scores with distinct peaks more than SLID scores without distinct peaks. Other embodiments of the present invention may use other weighting functions.

As with the fixed SLID algorithm, the adaptive SLID algorithm may be followed by a smoothed z-score algorithm to identify the peaks in the SLID scores. The smoothed z-score algorithm however requires choosing three key parameters, which is a significant challenge for boundary detection on real sequences where knowledge of appropriate parameter values may not be available.

For this reason, a parameter-free wavelet-based approach to peak identification is better suited for use with the adaptive SLID algorithm, though it may also be used with the fixed SLID algorithm. This wavelet-based approach convolves the adaptive SLID score $\overline{S}(k)$ with a smoothing kernel $\phi(k)$ of length l:

$$P(k) = \overline{S}(k) * \phi(k) = \sum_{i=0}^{l-1} \overline{S}(k-i)\phi(i) \qquad (Eq. 7)$$

Using this approach, peaks are defined at indices k such that $P(k)$ is locally maximal within the support of the smoothing kernel $\phi(k)$. Specifically, a peak is identified at index k if $P(k) > P(j)$ for $j=k-[l/2], \ldots k+[l/2]; j \neq k$. Due to this constraint, local peaks (false boundaries) may be eliminated whereas the more relevant peaks (true boundaries) are identified. Although it is possible to use multiple wavelet levels, a single wavelet level is typically sufficient. As an example, a lowpass filter of the biorthogonal wavelet family (bior6.8) may be used as the kernel.

While the above descriptions of the fixed and adaptive SLID algorithms employed 1D datasets, i.e., sequences, both algorithms may be applied to general datasets, including those having more than one dimension. The following exemplary applications of the fixed and adaptive SLID algorithms will likewise employ sequences for the sake of simplicity.

Further, while the above descriptions of the fixed and adaptive SLID algorithms employed some type of peak detection algorithm, for example, the smoothed z-score and wavelet-based approaches, other peak detection methods could be used in other embodiments of the present invention. These peak detection methods may be automated, such as the smoothed z-score and wavelet-based approaches, or they may be manual, in which, for example, an analyst reviews the SLID data to determine the peaks.

Application of the Fixed SLID Algorithm

To validate the SLID algorithm against multiple 1D datasets, sequences with known ground truth for boundaries using multiple dataset sources were synthesized. See R. Field Jr. et al., "Efficient Generalized Boundary Detection Using a Sliding Information Distance," IEEE Transactions on Signal Processing, vol. 68, pp. 6394-6401 (2020), the contents of which are incorporated herein by reference. The first sequence contains sections of text randomly selected from English and Spanish translations of a United Nations (UN) document. See "Children and armed conflict: Report of the secretary-general," http://research.un.org/en/docs/find/reports (accessed Mar. 10, 2020). The second sequence contains sections of audio randomly selected from a male and a female speaker from the LibriSpeech ASR corpus. See V. Panayotov and D. Povey, "Open speech and language resources," http://www.openslr.org/12/ (accessed Mar. 10, 2020) and V. Panayotov et al., "Librispeech: An ASR corpus based on public domain audio books," IEEE International Conference on Acoustics, Speech and Signal Processing (ICASSP), pp. 5206-5210 (2015). Each dataset contains 100 ground truth boundaries with section lengths s=512 tokens for quantifying algorithmic performance and computing precision-recall curves.

Figure 1A:
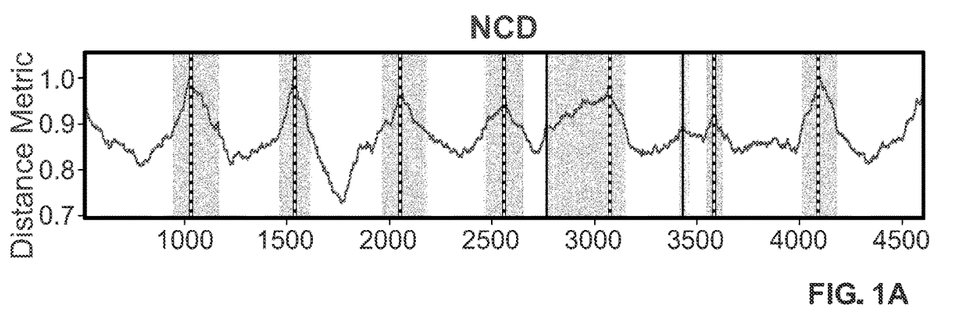
FIGS. 1A-1C illustrate the comparison results for boundary detection on written text by an embodiment of the present invention relative to two prior art boundary detection methods.
Figure 1B:
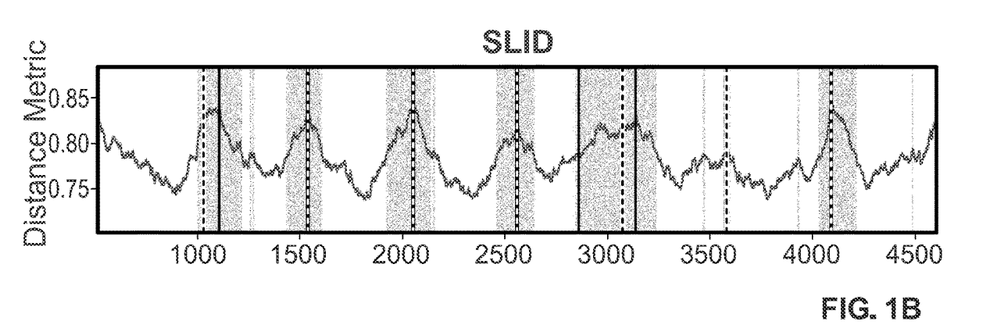
Figure 1C:
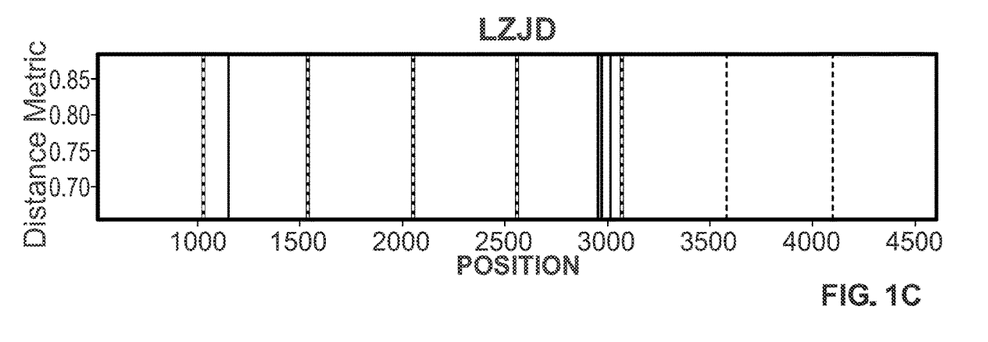

The first comparison provides results on identifying language boundaries in the UN documents using the NCD, SLID, and LZJD (another dictionary-based distance metric not optimized for a sliding boundary detection) methods. FIGS. 1A-1C illustrate the results for each of the three methods. The positions of true boundaries are denoted by the vertical dashed lines. As described above, every multiple of s=512 is a true boundary. The shaded regions indicate the sets K defined by Equation (3) for which the smoothed z-score algorithm indicates anomalous positions, and the vertical solid lines indicate k*, the boundaries identified within K. Thus, any instance of a solid line corresponding with a dashed line is a true positive. Conversely, any instance of a solid line not corresponding to a dashed line is a false positive.

As illustrated in FIGS. 1A-1C, all compression-based distance metrics provide some indication of boundaries, as indicated by peaks in the score near (or at) a true boundary. In fact, the NCD method illustrated in FIG. 1A has perfect precision at full recall, where the scores for the two false positives are lower than the true positives. However, using the NCD method to approximate the NID is very inefficient. For the window size w=512 and the relatively short sequences here, computation by the NCD method in FIG. 1A required 1100 seconds.

Table 1 summarizes the performance of each of the three methods with respect to the three desired qualities in a boundary detection scheme: (1) efficiency, (2) smoothness, or robustness to small changes in information content, and (3) the ability to accurately approximate the NID. The LZJD and SLID methods run three and four orders of magnitude, respectively, faster than the NCD method, and are still accurate approximations for the NID, as quantified by the correlation coefficient with the NCD method. Defining $\delta_k = d(k) - d(k-1)$ for $k=w, \ldots$, with $d(k)$ denoting a general distance metric at location k in the sequence, the SLID method yielded a much smaller standard deviation, $\sigma$, in $\delta_k$ compared to the LZJD method, indicating a smoother signal. As illustrated qualitatively in FIG. 1C, a noisy LZJD produces several false positives, whereas SLID, illustrated in FIG. 1B, produces a notably smoother score for improved boundary detection.

Table 1. Time, noisiness ($\sigma$), and correlation with NCD for the results illustrated in FIG. 1.

| Method | Time (seconds) | $\sigma$ | NCD Correlation |
| --- | --- | --- | --- |
| NCD | 1100 | 0.0019 | 1.00 |
| SLID | 0.2 | 0.0016 | 0.78 |
| LZJD | 3.6 | 0.0123 | 0.77 |

Figure 2:
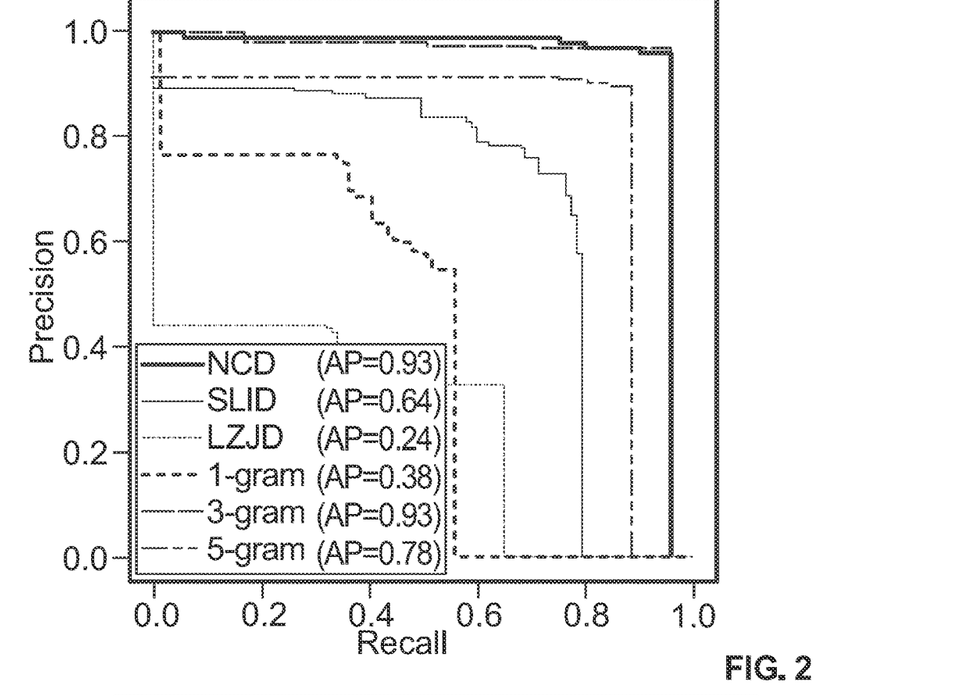
FIG. 2 illustrates the comparison results for precision recall of boundary detection on written text by an embodiment of the present invention relative to five prior art boundary detection methods.

To assess performance, FIG. 2 illustrates a precision recall (PR) graph with average precision (AP) scores. These results are obtained from the full dataset constructed from 100 segments of length s=512 chosen from the two translations of the UN document. The NCD method outperforms all other metrics but is extremely slow, while the SLID method significantly outperforms the LZJD method (SLID AP=0:64 versus LZJD AP=0:24). As discussed above, this result can primarily be attributed to the smoother signal with the SLID method, and therefore far fewer false positives.

For comparison to more traditional text-based methods, FIG. 2 also illustrates results for the cosine distance over adjacent sliding windows of n-gram distributions. The 3-gram distance, which is commonly used to describe written language, performs as well as NCD. See P.F. Brown et al., "Class-based n-gram models of natural language," Computational Linguistics, vol. 18, no. 4, pp. 467-479 (1992), the contents of which are incorporated herein by reference. In contrast, the 1-gram distance cannot capture the full complexities of the structural differences between Spanish and English text, and the 5-gram distance cannot capture the statistical distribution within the sliding window of width w=512. If the underlying data can be well-described by an n-gram, as is the case with text, then it is not surprising that an n-gram approach (with the appropriate n) can outperform a general compression-based method. However, in general, some a priori knowledge of the underlying data is needed to select the optimal n-gram. In contrast, compression-based methods are a good choice where there is no such a priori knowledge.

Figure 3A:
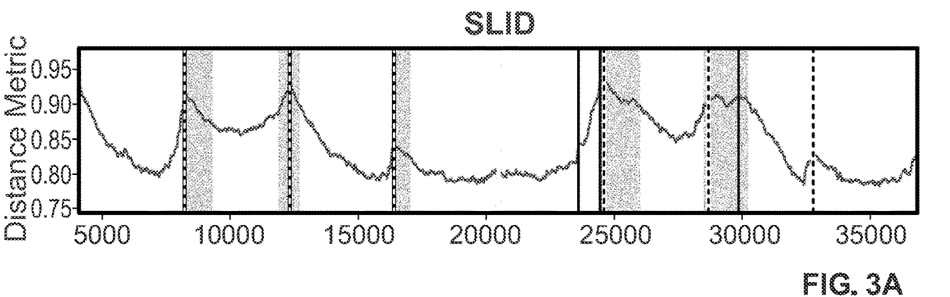
FIGS. 3A-3C illustrate the comparison results for boundary detection on an audio file by an embodiment of the present invention relative to two prior art boundary detection methods.
Figure 3B:
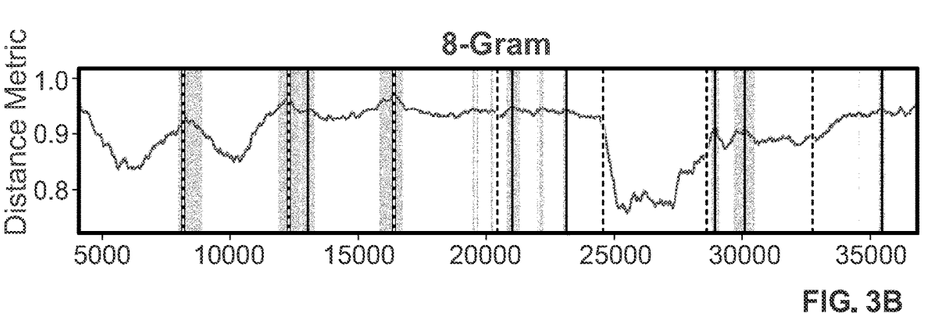
Figure 3C:
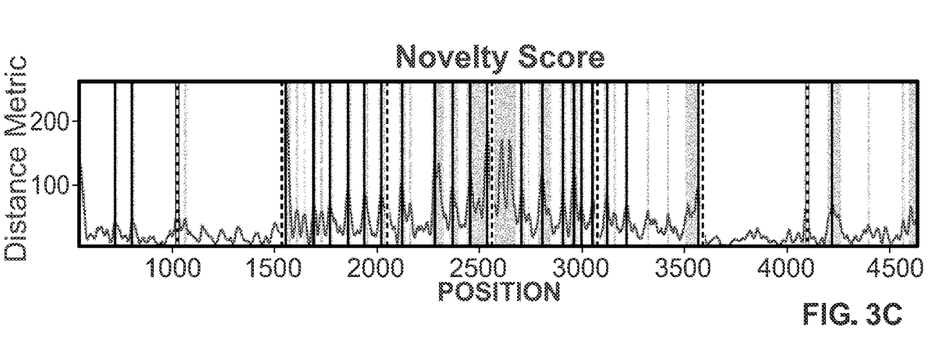
Figure 4:
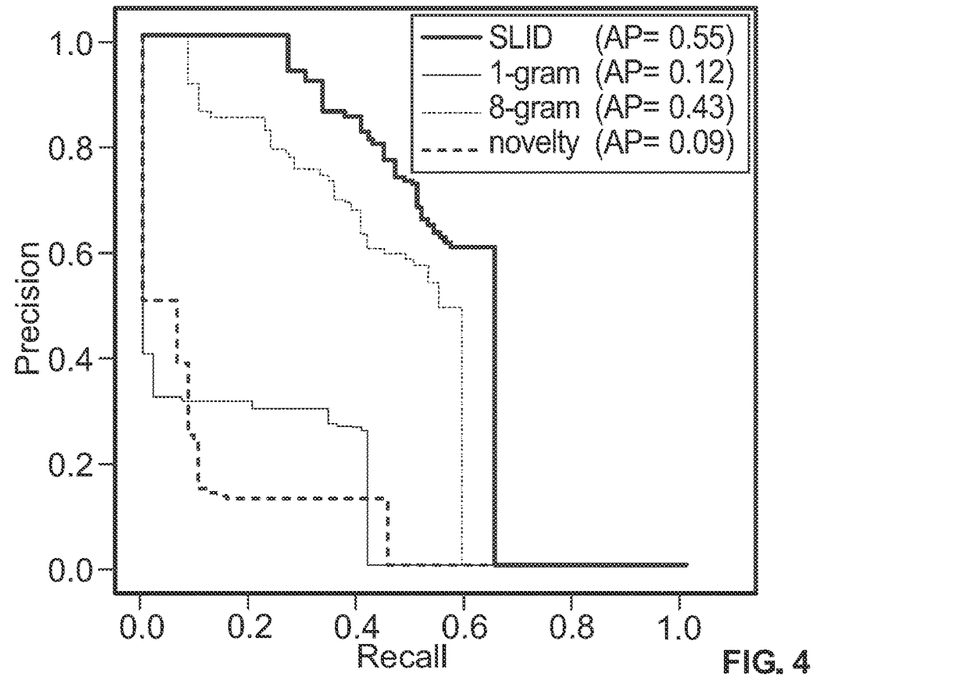
FIG. 4 illustrates the comparison results for precision recall of boundary detection on an audio file by an embodiment of the present invention relative to three prior art boundary detection methods.

The SLID method was also applied to an audio dataset, for which an n-gram is not expected to be the appropriate description of the underlying data. FIGS. 3A-3C illustrate the results for the SLID method, as well as an n-gram approach and a specialized method specifically developed to detect novelty in an audio dataset, respectively. See J. Foote, "Automatic audio segmentation using a measure of audio novelty," in IEEE International Conference on Multimedia & Expo (ICME) (2011), the contents of which are incorporated herein by reference. The dashed lines correspond to true boundaries, while the solid lines correspond to estimates k* as defined in Equation (3). Because each floating point value of the audio file is represented by eight bytes, the horizontal axes of the SLID and 8-gram methods are eight times the scale of the novelty score, which is computed using floating point values. As illustrated in FIG. 3A, the peaks produced by the SLID method are more pronounced at the true boundaries than the peaks produced by the 8-gram method illustrated in FIG. 3B. Furthermore, there are fewer false positives, particularly when compared with the audio novelty score illustrated in FIG. 3C (which appears to measure local changes in a given frequency). As a result, the PR curve illustrated in FIG. 4 shows that the SLID method outperforms both the n-gram and the audio novelty methods.

While the above examples employed a constant window width w=512, other embodiments of the present invention may employ different window widths. In this manner, both course- and fine-grained boundaries may be identified.

Comparing the Fixed and Adaptive SLID Algorithms

Figure 5:
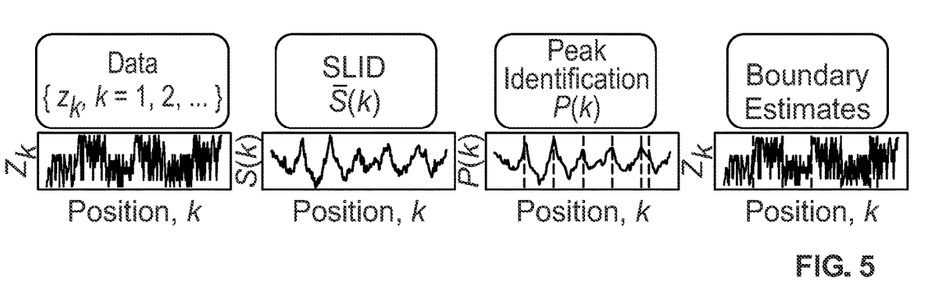
FIG. 5 illustrates the overall flow of one embodiment of the present invention relative to a dataset.

FIG. 5 illustrates the application of the adaptive SLID algorithm to a generic sequence. The left-most panel of FIG. 5 illustrates the dataset $\{z_k, k=1, 2, \ldots\}$ as a function of position k. The left-center panel illustrates the values output by the adaptive SLID algorithm $\bar{S}(k)$, again as a function of position k. As illustrated in the left-center panel, there are six peaks in the $\bar{S}(k)$ values, each indicating a potential boundary position. The right-center panel of FIG. 5 illustrates the peak identification values P(k) as a function of position k. The effect of the smoothing kernel $\phi(k)$ is clearly evident in the right-center panel. The six vertical lines in the right-center panel indicate the identified peaks corresponding to estimated boundary positions in the dataset. The right-most panel of FIG. 5 again illustrates the dataset as a function of position k, but has superimposed on it the estimated boundary positions. As can be seen, the estimated boundary positions correspond to distinct changes, i.e., boundaries, in the dataset.

The adaptive SLID algorithm was then applied to a generated synthetic sequence. Let $d^{(1)}=\{t_1, t_2, t_3, t_4, t_5, t_6\}$ denote a collection or dictionary of tokens. A first section of synthetic data is generated by drawing tokens at random from dictionary $d^{(1)}$. A second, adjacent section of synthetic data is then generated by drawing tokens at random from a different dictionary $d^{(2)}=\{t_5, t_6, t_7, t_8, t_9, t_{10}\}$. Each token is drawn according to a specified set of conditional probabilities $$p_{ij}=Pr(z_{k+1}=d_j^{(q)}|z_k=d_i^{(q)}) \quad \text{(Eq. 8)}$$

for i,j=0, ... 5, and q=1, 2. By this process, a boundary in the dataset is created and located between the first and second sections. This two-step process can be repeated to generate a synthetic dataset with multiple boundaries. Because locating boundaries is trivial when the two dictionaries are disjoint, the dictionaries $d^{(1)}$ and $d^{(2)}$ share tokens $t_5$ and $t_6$.

To generate the synthetic dataset, it remains to define the lengths of the alternating sections. Let a=30 and b=60 be two section lengths (number of tokens). The synthetic datasets may then be generated in two ways. In the first case, a synthetic dataset with "drift" is formed by concatenating 200 sections of tokens each of length a followed by 200 additional sections of length b. In the second case, the synthetic dataset includes 400 sections of variable section lengths by allowing each section length to be a random variable equal to either a or b with equal probability.

Figure 6A:
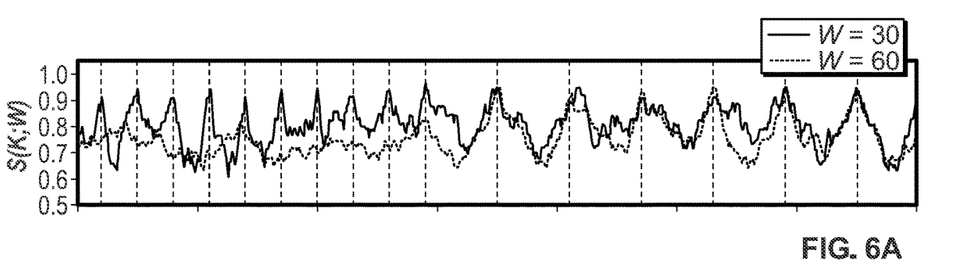
FIGS. 6A-6C illustrate the comparison results for boundary detection on a synthetic dataset by different embodiments of the present invention relative.

FIG. 6A illustrates two applications of the fixed SLID algorithm with corresponding fixed window sizes, specifically, the window sizes are chosen to be equal to one of the two section lengths, i.e., w=30 or 60. Choosing the window size equal to the section length assumes some a priori knowledge about the underlying data. Even so, it can be seen that neither S(k, 30) nor S(k, 60) is ideal for identifying peaks (boundaries) throughout the full sequence. While the different SLID scores reveal boundaries when the window size w is equal to the section length, the same is not true when there is a mismatch. For S(k, 30) and section lengths b=60, the smaller window size captures insufficient statistics of the dataset, thereby producing a noisy score that fails to reveal distinct peaks. For S(k, 60) and section lengths a=30, the larger window size captures the same statistics in adjacent windows, thereby producing a flat score without any distinct peaks.

Figure 6B:
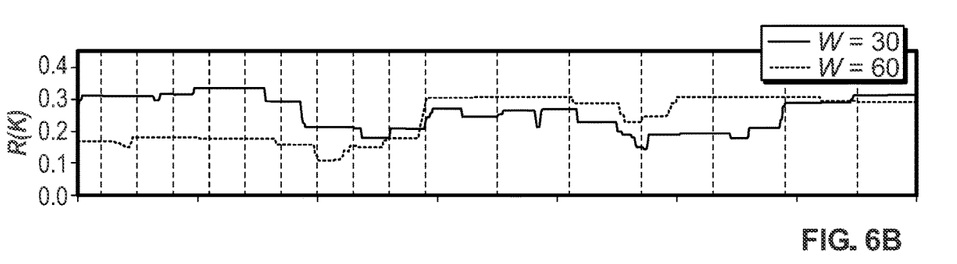

Instead of a single fixed window size, the SLID algorithm would ideally pick the window size to match the underlying section length, that is, to adapt to the dataset. Equation (4) defines one such approach using a weighted collection of SLID scores. FIG. 6B illustrates a potential weighting using the local range defined by Equation (5). Initially, when a=30, the local range for S(k, 30) is larger than the local range for S(k, 60); when the sequence changes to sections of length b=60, the reverse is true. This change in the local range is a desired property for a weighting scheme that adapts to the underlying sequence.

Figure 6C:
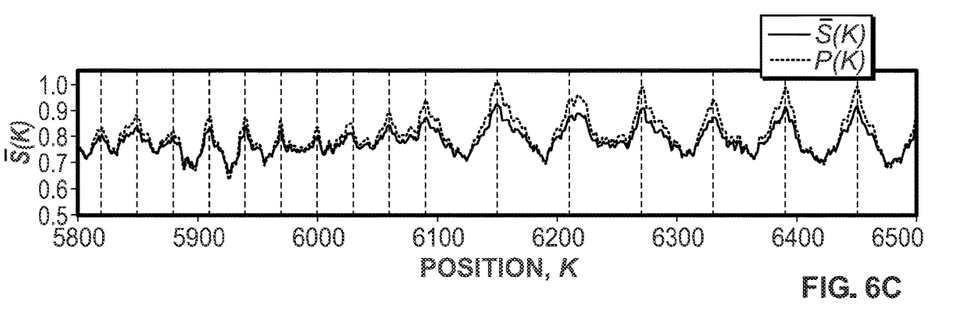

FIG. 6C illustrates the result for adaptive SLID $\bar{S}(k)$ using a collection of m=7 windows with sizes $w_i=\{10, 20, \ldots, 80\}$, while employing the local range approach for the weighting scheme. In contrast to the fixed SLID algorithm with its fixed window size, the adaptive SLID algorithm reveals distinct peaks, i.e., boundaries, both before and after the change from sections of length a=30 to sections of length b=60. In addition to illustrating $\overline{S}(k)$, FIG. 6C also illustrates the corresponding values for P(k) used to identify peaks as defined by Equation (7). The smoothing and emphasis on peaks following the convolution is clearly evident.

Figure 7:
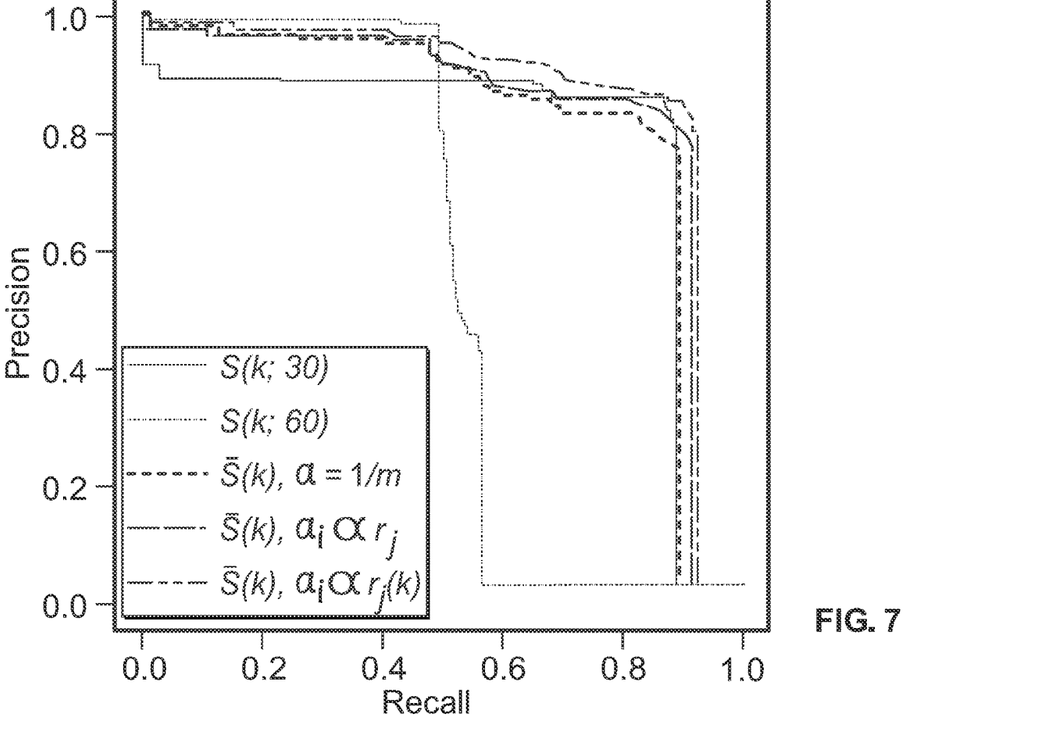
FIG. 7 illustrates the comparison results for precision recall of boundary detection on a synthetic dataset by different embodiments of the present invention.

The performance of the fixed and adaptive SLID algorithms is quantified by computing the PR curve over the synthetic dataset, illustrated in FIG. 7. Each predicted peak using the wavelet method of the adaptive SLID algorithm is considered a correct detection if it is within a distance of 2 from a ground-truth boundary location. The adaptive SLID algorithm yields higher precision at higher recall, although the fixed SLID algorithm with a window size of 60 exhibits slightly higher precision at low recall.

The fixed and adaptive SLID algorithms were also run on 115 .so files that come with the default Python 2.7 distribution on the Linux operating system. These files follow the executable and linking format (ELF). Each ELF file consists of several sections, such as .text, .data, etc., that store the compiled code, data, and other executable resources. The location of boundaries between sections are identified in the file's section header table. By using this section header table, the ground-truth information, i.e., the section start boundary locations, on each ELF file can be extracted. Importantly, because each section can contain additional custom subsections and data structures that are not defined by the ELF specification, not all true boundaries are identified by the extracted ground truth information.

Figure 8:
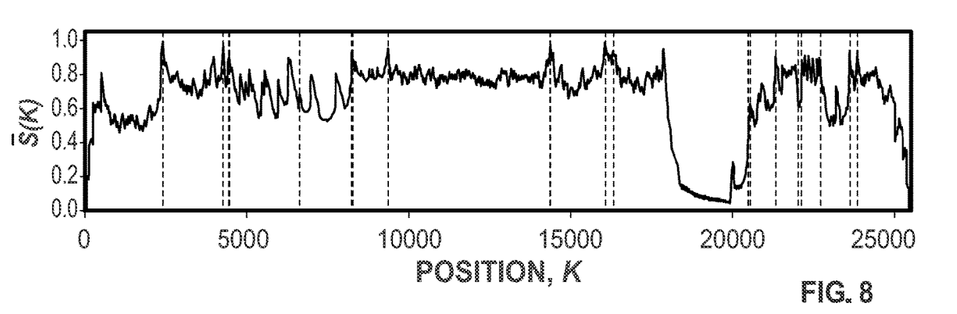
FIG. 8 illustrates the results for boundary detection on an executable and linking format dataset by an embodiment of the present invention relative.

FIG. 8 illustrates the application of the adaptive SLID algorithm $\overline{S}(k)$ to a single ELF file using weights $\alpha_i=1/m$ with m=4 window sizes corresponding to $w_i=\{64, 128, 256, 512\}$. These window sizes are chosen based on a priori knowledge that computers operate on powers of two. Results using other weights are qualitatively similar by visual inspection.

Figure 9:
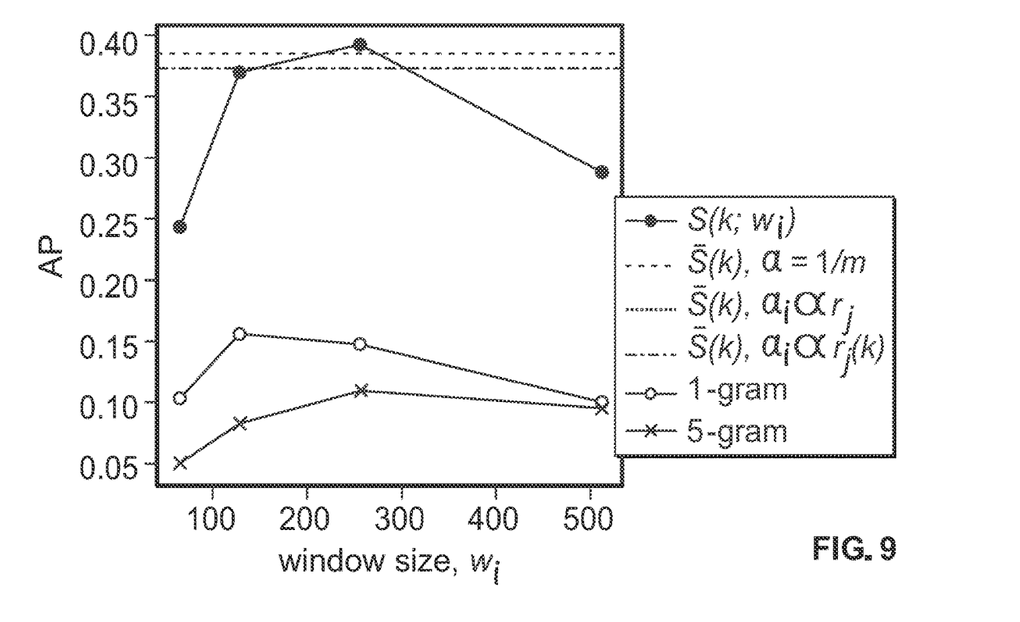
FIG. 9 illustrates the comparison results for precision recall of boundary detection on an executable and linking format dataset by different embodiments of the present invention relative to a prior art boundary detection method.

While many peaks correspond to ground truth boundaries (vertical lines) identified in the section header table, there are many additional peaks corresponding to boundaries not identified by the section header table. Rather than false positives, these peaks correspond to boundaries in lookup tables storing fixed-length or ASCII string entries. Nevertheless, performance can be assessed using only the ground-truth boundary locations extracted from the section header table. FIG. 9 illustrates the AP, where the real AP could be higher than the AP reported here due to the lack of knowledge about additional boundaries that are present within each ELF section.

For $\overline{S}(k)$, the weights that are independent of k outperform the weight based on the local range, which depends on k. As with the case for the synthetic dataset with variable section lengths throughout the sequence, when there is a distribution of section lengths, the adaptive SLID algorithm using a weight that is independent of k is sufficient. As illustrated in FIG. 9, S(k, 256) outperforms $\overline{S}(k)$. However, choosing a single appropriate window size requires a priori knowledge about the underlying sequence. The advantage of the adaptive SLID algorithm's $\overline{S}(k)$ is that comparable AP values may be achieved by choosing a collection of window sizes that spans the potential section lengths of interest. FIG. 9 also illustrates the performance of the fixed and adaptive SLID algorithms as an approximation of the universal normalized information distance (NID), with a more traditional distance metric, namely one based on the cosine distance between adjacent n-gram distributions. FIG. 8 illustrates that both $\overline{S}(k)$ and $\overline{S}(k, w_i)$ outperform the n-gram methods using n =1 or n=5.

While the above described embodiments of the present invention were described in terms of methods, other embodiments may take other forms. For example, some embodiments of the present invention may take the form of a system with a processor and a memory with instructions for implementing the methods. Still other embodiments may take the form of a computer-readable storage device with instructions for implementing the methods. Note that a propagated signal is not included within the scope of a computer-readable storage device.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for detecting a boundary within a dataset, the dataset including one or more tokens, the method comprising the steps of:
   initializing a set of fixed sliding information distance (SLID) scores to zero;
   for each potential border within the dataset:
      generating a first sub-dataset window and a second sub-dataset window, the second sub-dataset window adjacent the first sub-dataset window at the potential border, each of the first sub-dataset window and the second sub-dataset window being a respective sub-dataset of the dataset, each of the first sub-dataset window and the second sub-dataset window having a single fixed window size;
      if the potential border is an initial potential border, computing an initial ordered list of subsequences for each token in the first sub-dataset window and the second sub-dataset window;
      if the potential border is not the initial potential border, computing a subsequent ordered list of subsequences for each token in the first sub-dataset window and the second sub-dataset window by dropping a first entry of a previous ordered list of subsequences for each token in the first sub-dataset window and the second sub-dataset window and appending an entry for a last token in the first sub-dataset window and the second sub-dataset window;
      computing a corresponding fixed SLID score at the potential border based on the thus computed initial or subsequent ordered list of subsequences;
      incrementing the potential border;
      repeating the steps of generating a first sub-dataset window and a second sub-dataset window, computing a subsequent ordered list of subsequences, computing a corresponding fixed SLID score, and incrementing the potential border for all potential borders; and
   identifying the boundary within the dataset at the potential border corresponding to an anomalous fixed SLID score.

2. The method of claim 1, wherein the step of computing the ordered list of subsequences employs a dictionary approach.

3. The method of claim 2, wherein the dictionary approach includes one of a Lempel-Ziv, a Macedonas, a Koga, or a Cerra-Datcu dictionary approach.

4. The method of claim 1, wherein the step of identifying the boundary within the dataset employs a smoothed z-score algorithm with incremented potential border values and a smoothed z-score algorithm with decremented potential border values.

5. The method of claim 1, wherein the step of identifying the boundary within the dataset employs a wavelet-based algorithm in which the fixed SLID score is convolved with a smoothing kernel.

6. A method for detecting a boundary within a dataset, the dataset including one or more tokens, the method comprising the steps of:
initializing a set of adaptive sliding information distance (SLID) scores to zero;
for each potential border within the dataset:
initializing a set of fixed SLID scores to zero;
for each of m fixed window sizes:
generating a first sub-dataset window and a second sub-dataset window, the second sub-dataset window adjacent the first sub-dataset window at the potential border, each of the first sub-dataset window and the second sub-dataset window being a respective sub-dataset of the dataset, each of the first sub-dataset window and the second sub-dataset window having an initial fixed window size;
if the potential border is an initial potential border, computing an initial ordered list of subsequences for each token in the first sub-dataset window and the second sub-dataset window;
if the potential border is not the initial potential border, computing a subsequent ordered list of subsequences for each token in the first sub-dataset window and the second sub-dataset window by dropping a first entry of a previous ordered list of subsequences for each token in the first sub-dataset window and the second sub-dataset window and appending an entry for a last token in the first sub-dataset window and the second sub-dataset window;
computing a corresponding fixed SLID score at the potential border based on the thus computed initial or subsequent ordered list of subsequences;
incrementing the fixed window size;
repeating the steps of generating a first sub-dataset window and a second sub-dataset window, computing a subsequent ordered list of subsequences, computing a corresponding fixed SLID score, and incrementing the potential border for all fixed window sizes;
computing a corresponding adaptive SLID score by summing the product of a respective SLID score and a respective weighting function value over all fixed window sizes;
incrementing the potential border;
repeating the steps of initializing a set of fixed SLID scores to zero, generating a first sub-dataset window and a second sub-dataset window, computing a subsequent ordered list of subsequences, computing a corresponding fixed SLID score, incrementing the fixed window size, computing a corresponding adaptive SLID score, and incrementing the potential border for all potential borders; and
identifying the boundary within the dataset at the potential border corresponding to an anomalous adaptive SLID score.

7. The method of claim 6, wherein the step of computing the ordered list of subsequences employs a dictionary approach.

8. The method of claim 7, wherein the dictionary approach includes one of a Lempel-Ziv, a Macedonas, a Koga, or a Cerra-Datcu dictionary approach.

9. The method of claim 6, wherein the step of identifying the boundary within the dataset employs a smoothed z-score algorithm with incremented potential border values and a smoothed z-score algorithm with decremented potential border values.

10. The method of claim 6, wherein the step of identifying the boundary within the dataset employs a wavelet-based algorithm in which the fixed SLID score is convolved with a smoothing kernel.

11. The method of claim 6, wherein the step of computing a corresponding adaptive SLID score employs one of a local range based weighting function or a global range based weighting function.

12. A non-transitory computer-readable storage device comprising instructions to be executed by a computer, the instructions including the steps of:
initializing a set of adaptive sliding information distance (SLID) scores to zero;
for each potential border within the dataset:
initializing a set of fixed SLID scores to zero;
for each of m fixed window sizes:
generating a first sub-dataset window and a second sub-dataset window, the second sub-dataset window adjacent the first sub-dataset window at the potential border, each of the first sub-dataset window and the second sub-dataset window being a respective sub-dataset of the dataset, each of the first sub-dataset window and the second sub-dataset window having an initial fixed window size;
if the potential border is an initial potential border, computing an initial ordered list of subsequences for each token in the first sub-dataset window and the second sub-dataset window;
if the potential border is not the initial potential border, computing a subsequent ordered list of subsequences for each token in the first sub-dataset window and the second sub-dataset window by dropping a first entry of a previous ordered list of subsequences for each token in the first sub-dataset window and the second sub-dataset window and appending an entry for a last token in the first sub-dataset window and the second sub-dataset window;
computing a corresponding fixed SLID score at the potential border based on the thus computed initial or subsequent ordered list of subsequences;
incrementing the fixed window size;
repeating the steps of generating a first sub-dataset window and a second sub-dataset window, computing a subsequent ordered list of subsequences, computing a corresponding fixed SLID score, and incrementing the potential border for all fixed window sizes;

computing a corresponding adaptive SLID score by summing the product of a respective SLID score and a respective weighting function value over all fixed window sizes;

incrementing the potential border;

repeating the steps of initializing a set of fixed SLID scores to zero, generating a first sub-dataset window and a second sub-dataset window, computing a subsequent ordered list of subsequences, computing a corresponding fixed SLID score, incrementing the fixed window size, computing a corresponding adaptive SLID score, and incrementing the potential border for all potential borders; and identifying the boundary within the dataset at the potential border corresponding to an anomalous adaptive SLID score.

13. The computer-readable storage device of claim 12, wherein the step of computing the ordered list of subsequences employs a dictionary approach.

14. The computer-readable storage device of claim 13, wherein the dictionary approach includes one of a Lempel-Ziv, a Macedonas, a Koga, or a Cerra-Datcu dictionary approach.

15. The computer-readable storage device of claim 12, wherein the step of identifying the boundary within the dataset employs a smoothed z-score algorithm with incremented potential border values and a smoothed z-score algorithm with decremented potential border values.

16. The computer-readable storage device of claim 12, wherein the step of identifying the boundary within the dataset employs a wavelet-based algorithm in which the fixed SLID score is convolved with a smoothing kernel.

17. The computer-readable storage device of claim 12, wherein the step of computing a corresponding adaptive SLID score employs one of a local range based weighting function or a global range based weighting function.

\* \* \* \* \*